United States Patent [19]

Park et al.

[11] Patent Number: 5,451,291

[45] Date of Patent: Sep. 19, 1995

[54] METHOD FOR FORMING A VIA CONTACT HOLE OF A SEMICONDUCTOR DEVICE

[75] Inventors: Sung-Kil Park, Kyoungki; Dong-Sauk Kim; Yong-Hyeock Yoon, both of Seoul, all of Rep. of Korea

[73] Assignee: Hyundai Electronics Industries Co., Ltd., Kyoungki, Rep. of Korea

[21] Appl. No.: 38,155

[22] Filed: Mar. 26, 1993

[30] Foreign Application Priority Data

Mar. 31, 1992 [KR] Rep. of Korea ............... 92-5309

[51] Int. Cl.6 .................. B44C 1/22; C03C 15/00; C23F 1/02
[52] U.S. Cl. .................... 156/644.1; 134/2; 134/26; 437/194; 437/225; 437/228
[58] Field of Search ............ 437/187, 189, 194, 225, 437/228, 229, 235, 238, 245; 156/644, 650, 652, 653, 656, 657, 659.1, 661.1; 134/26, 27, 2, 32, 33, 34

[56] References Cited

U.S. PATENT DOCUMENTS 5,175,124 12/1992 Winebarger ............... 437/180

FOREIGN PATENT DOCUMENTS 0295257 12/1991 Japan .................... 437/194

Primary Examiner—William Powell
Attorney, Agent, or Firm—Merchant, Gould, Smith, Edell, Welter & Schmidt

[57] ABSTRACT

In the formation of a via contact hole of a semiconductor device, a polymer layer on the sidewall of a photoresist layer and via contact hole is effectively removed and the short of the via contact hole does not occur. For achieving such purpose, a wafer is cleaned in deionized water being added with $CO_2$ gas during the process used for forming the via contact hole, and a protecting film ($Al_2O_3$) is formed on a metal layer. Thereafter, since the polymer layer and a part of the photoresist layer is removed, the metal layer is not eroded and the polymer layer is completely removed.

20 Claims, 3 Drawing Sheets

Fig. 1c "Prior Art"
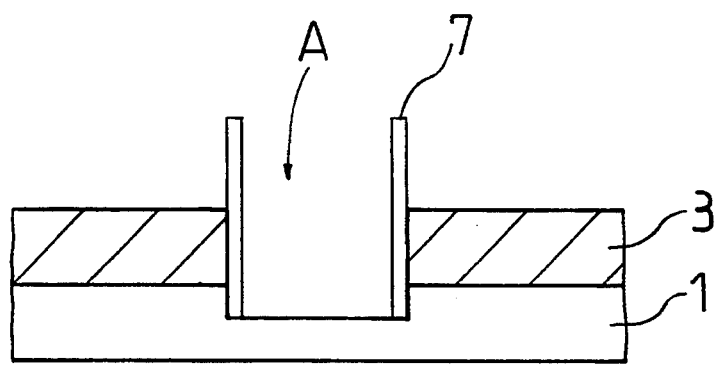
Fig. 1d "Prior Art"
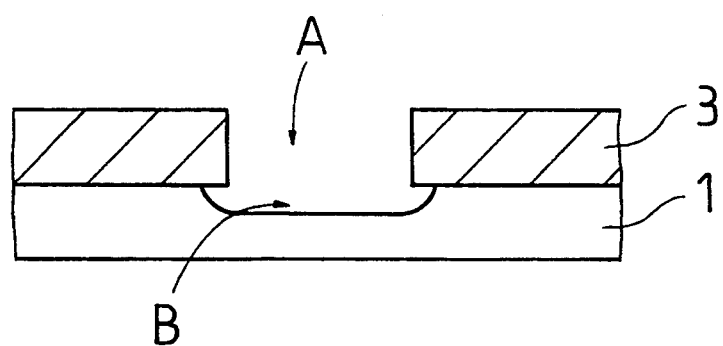

METHOD FOR FORMING A VIA CONTACT HOLE OF A SEMICONDUCTOR DEVICE

BACKGROUND OF THE INVENTION

1. Field of the Invention

This invention relates to a method for forming a via contact hole in a semiconductor device, more particularly to a method for removing the residual of a photoresist layer and a polymer layer after the etching process used for forming the via contact hole is completed.

2. Information Disclosure Statement

As is generally known, in the process of forming a via contact hole in a semiconductor device, it is very important to remove the residual of a polymer layer formed at the via contact hole during the etching process. Moreover, since the manufacturing process of a highly integrated semiconductor device requires equipment having various structures, it is difficult to perform the above mentioned process used for removing the residual of the polymer layer.

In the manufacturing process for forming the via contact hole of a semiconductor device, after the via contact hole is formed by the etching process, first, a photoresist layer is removed using $O_2$ plasma stripper and, second, the polymer layer is removed using deionized water and stripper solution. In such a case, as in the case of overetching the via contact hole, most etching processes for forming the via contact hole etches a part of the metal layer beneath a $SiO_2$ layer as well as the $SiO_2$ layer. Therefore, the polymer layer produced by the reaction of the photoresist layer, the $SiO_2$ layer and metal layer is formed on the sidewall of the photoresist layer on the $SiO_2$ layer associated with the via contact hole.

When the photoresist layer is removed using $O_2$ plasma stripper, the above polymer layer is transformed and hardened so that it is not easily removed by the next process for removing the polymer layer. In order to remove the polymer layer, an etchant which may etch the metal layer or a strong stripper solution is used. However, the problem is that the short of the via contact hole results by etching a part of the metal layer as well as the polymer layer.

SUMMARY OF THE INVENTION

It is an object of this invention to provide a process for removing the residual polymer layer, which is formed on the sidewall of the photoresist layer and via contact hole during the etching process used for forming the via contact hole, without etching the metal layer.

To achieve the above objectives, in the present invention, a $SiO_2$ layer is formed on the metal layer and the photoresist pattern is coated over the $SiO_2$ layer. After that, using the above mentioned photoresist pattern, a via contact hole is formed by the etching process employing the photoresist pattern as a mask and a wafer is then cleaned in the deionized water being added with $CO_2$ gas. After completing the cleaning process, the polymer layer and a part of the photoresist layer are removed using the stripper solution. Finally, the photoresist layer remaining on the $SiO_2$ layer is removed.

The present invention includes the additional process cleaning the wafer in isopropyl alcohol at room temperature for 1 to 10 minutes in order to remove the deionized water after a wafer is cleaned in the deionized water being added with $CO_2$ gas.

The present invention also includes the additional process of cleaning the wafer in isopropyl alcohol at room temperature for 1 to 10 minutes in order to remove the stripper solution after the polymer layer on the sidewall of the via contact hole and a part of the photoresist layer on the $SiO_2$ is removed using the stripper solution, cleaning the wafer in the deionized water being added with 0.2 to 3 l/min. of $CO_2$ gas for 1 to 10 minutes, and drying the wafer by a dryer.

BRIEF DESCRIPTION OF THE DRAWINGS

For fuller understanding of the nature and objects of the invention, reference should be made to the following detailed description taken in conjunction with the accompanying drawings in which:

FIG. 1c is a cross sectional view depicting the process removing the photoresist layer on the $SiO_2$ layer after the via contact hole is formed according to the prior art.

FIG. 1d is a cross sectional view depicting the process for removing a part of the metal layer when the polymer layer on the sidewall of the via contact hole is removed according to the prior art.

DESCRIPTION OF THE PREFERRED EMBODIMENTS

Figure 1A:
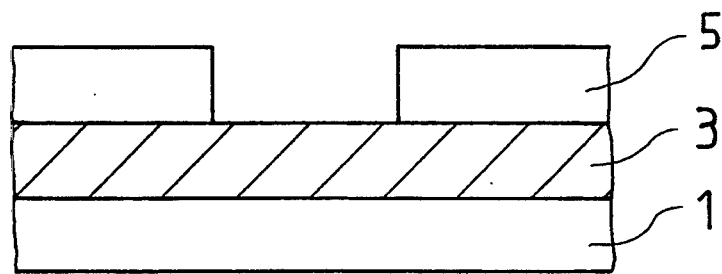
FIG. 1a is a cross sectional view depicting the process of forming a mask pattern by coating a photoresist layer over the $SiO_2$ layer formed on a metal layer according to the prior art.

The novel feature of the present invention may be understood from the accompanying description when taken in conjunction with the accompanying drawings where similar reference characters refer to similar parts throughout the several views of the drawings.

FIG. 1a to FIG. 1d are cross sectional views illustrating the formation of a via contact hole according to the conventional manufacturing process of a semiconductor device. FIG. 1a is a cross sectional view illustrating the formation of a mask pattern after a photoresist layer 5 is coated on a $SiO_2$ layer 3 which is formed on a metal layer 1 consisting of Aluminum.

Figure 1B:
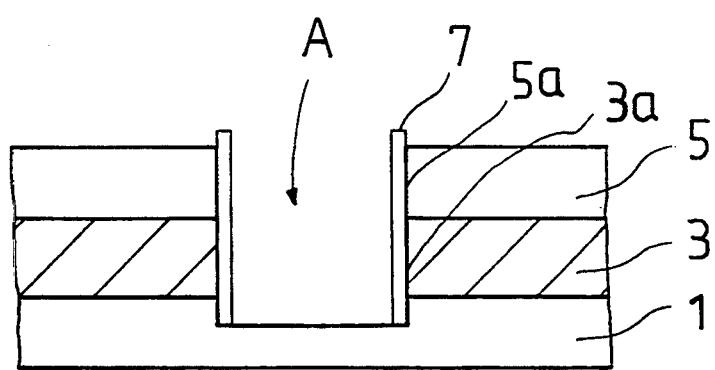
FIG. 1b is a cross sectional view illustrating the formation of a polymer layer on the sidewall of a via contact hole when a via contact hole is formed by the etching process, wherein the via contact hole is formed by employing the photoresist pattern as a mask as shown in FIG. 1a according to the prior art.

As shown in FIG. 1b, the via contact hole A is formed by the etching process employing the photoresist pattern as a mask. In most etching processes used for forming the via contact hole, the via contact hole is overetched so that a part of the metal layer 1 as well as $SiO_2$ layer 3 is etched. In such cases, the polymer layer 7 on the sidewall 5a of the photoresist layer 5 and on the sidewall 3a of the via contact hole A is formed by the reaction of the photoresist layer 5, $SiO_2$ layer 3 and metal layer 1.

FIG. 1c and FIG. 1d are cross sectional views depicting the process for removing the photoresist layer 5 formed on the $SiO_2$ layer 3. Since the polymer layer 7 shown in FIG. 1b is transformed and hardened while the photoresist layer 5 is removed using $O_2$ plasma stripper, it is very difficult to remove the polymer layer 7 during the process used for removing the polymer layer 7.

As shown in FIG. 1d, when the polymer layer 7 forming on the sidewall of the via contact hole A is removed, the $SiO_2$ layer 3 and a part of the metal layer 1 are etched because an etchant which may etch the metal layer 1 or a strong stripper solution is used resulting in the short of the via contact hole A. Therefore, the problem is that the semiconductor manufacturing process is performed in cases where the metal layer 1 is eroded or the polymer layer 7 is remained.

Figure 2A:
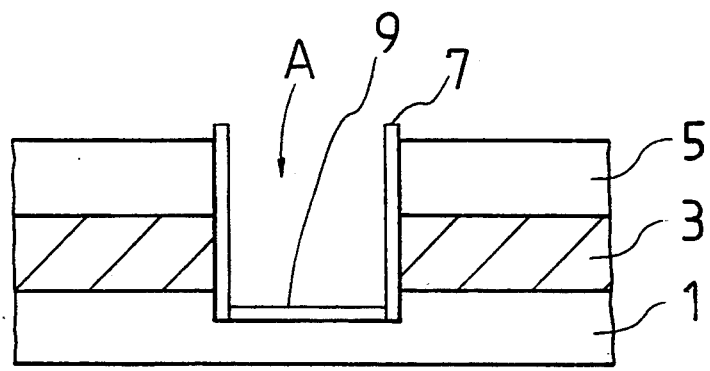
FIG. 2a is a cross sectional view illustrating the formation of a protecting film ($Al_2O_3$) on the bottom of the via contact hole by cleaning a wafer in deionized water being added with $CO_2$ after the via contact hole has been formed by the etching process according to the present invention.
Figure 2B:
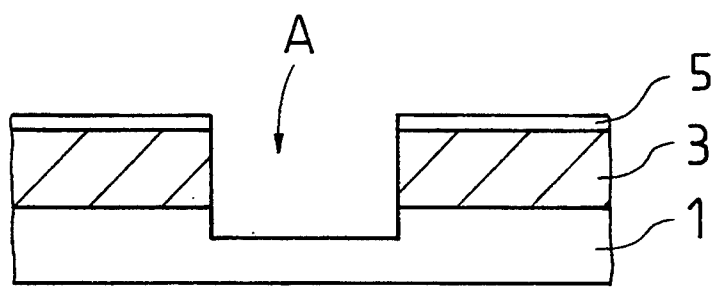
FIG. 2b is a cross sectional view illustrating the process for removing the polymer layer on the sidewall of the via contact hole according to the present invention.
Figure 2C:
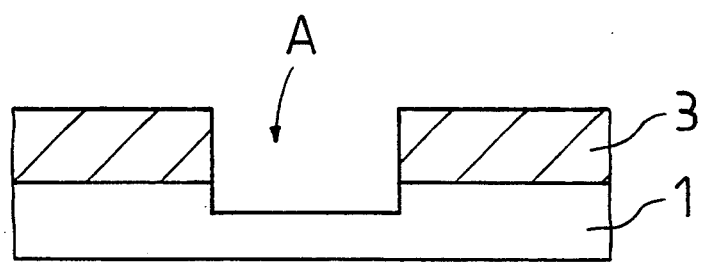
FIG. 2c is a cross sectional view illustrating the process of removing the residual of the photoresist layer on the $SiO_2$ layer according to the present invention.

FIG. 2a to FIG. 2c are cross sectional views illustrating the formation of the via contact hole of a semiconductor device according to the present invention.

As shown in FIG. 2a, the $SiO_a$ layer 3 and photoresist layer 5 used as a mask are formed on the metal layer 1 consisting of Aluminum and the protecting film ($Al_2O_3$) is formed on the bottom of the via contact hole A by cleaning a wafer in the deionized water being added with $CO_2$ gas after the via contact hole A is formed by the etching process. In this case, the wafer is cleaned in the deionized water being added with 0.2 to 1 l/min. of $CO_2$ gas for 5 to 30 minutes after the via contact hole is formed.

As is generally known, the metal layer 1 beneath the $SiO_2$ layer 3 is eroded by the reaction of $H_2O$ and the metal reactants ($AlF_3$, $Al(OH)_3$). In this process, the deionized water being added with $CO_2$ gas prevents the metal layer 1 from eroding and the thin and uniform protecting film ($Al_2O_3$) 9 on the surface of the metal layer 1 is formed by the reaction of $H_2CO_3$ and the metal layer where $H_2CO_3$ is produced by the reaction of $CO_2$ gas and the deionized water. After cleaning in the deionized water, the wafer is cleaned in good volatile alcohol which is easily diluted with the stripper solution in order that $H_2O$ remaining on the wafer is not diluted with the stripper solution.

Referring to FIG. 2b, the polymer layer 7 forming on the sidewall of the via contact hole A is removed according to the present invention. The polymer layer 7 and photoresist layer 5 formed on the sidewall of the via contact hole A is removed using stripper solution at 50° C. to 100° C. for 5 to 30 minutes. In the above process, the protecting film 9 on the surface of the metal layer 1 protects the metal layer 1 from the erosion occurred by the stripper solution, and the polymer layer 7 is removed in a short time and most photoresist layer is removed.

In such cases, since the stripper solution is circulated through a circulation pump in the present invention, the polymer layer 7 and photoresist layer 5 are well reacted and stuck on the surface of the wafer and at the via contact hole A. After the above process is completed, the stripper solution on the wafer is cleaned by isopropyl alcohol and the cleaning process using the deionized water is then easily performed. After that, the stripper solution and isopropyl alcohol on the wafer is cleaned by deionized water being added with 0.2 to 1 l/min. of $CO_2$ gas and the wafer is dried by the spin dryer.

As shown in FIG. 2c, the residual of the photoresist layer 5 on the $SiO_2$ layer 3 is completely removed using $O_2$ plasma stripper. Therefore, the process for forming the via contact hole A is completed. In such a case, the protecting film 9 is formed on the metal layer 1 and most polymer layer 7 and photoresist layer 5 are removed by using the stripper solution.

Finally, the residual of the photoresist layer 5 is completely removed using $O_2$ plasma stripper. Therefore, the advantage of the present invention is that the erosion of the metal layer 1 is prevented while the polymer is removed.

As described above, the polymer layer 7 is effectively removed and the metal layer 1 is not damaged during the process forming the via contact hole A by using only $CO_2$ gas in the conventional equipment according to the present invention. Therefore, the yield and reliability of the wafer is improved and the expenses purchasing the equipment are cut down.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit any scope of the invention.

What is claimed is:

1. A method of forming a via contact hole of a semiconductor device comprising the steps of:
   forming a metal layer on a wafer;
   forming a $SiO_2$ layer on said metal layer;
   forming a photoresist pattern after a photoresist layer is coated on said $SiO_2$ layer;
   forming a via contact hole by an etching process employing said photoresist pattern as a mask;
   cleaning the wafer in deionized water being added with $CO_2$ gas after said etching process is completed, thereby forming a protecting film on the bottom of said via contact hole;
   removing a polymer layer on the sidewall of said via contact hole and a part of said photoresist layer on said $SiO_2$ layer by using a stripper solution after the process of cleaning said wafer in said deionized water is completed; and
   removing the residual of said photoresist layer on said $SiO_2$ layer.

2. A method of forming a via contact hole of a semiconductor device claimed in claim 1, wherein said metal layer consists of Aluminum.

3. A method of forming a via contact hole of a semiconductor having a metal layer claimed in claim 1, further comprising the step of cleaning said wafer in isopropyl alcohol at room temperature for 1 to 10 minutes in order to remove said deionized water after said wafer is cleaned in said deionized water being added with $CO_2$ gas.

4. A method of forming a via contact hole of a semiconductor device claimed in claim 1, wherein the temperature range of said stripper solution for removing said polymer layer on the sidewall of said via contact hole and said photoresist layer on said $SiO_2$ layer is from 50 ° C. to 100 ° C.

5. A method of forming a via contact hole of a semiconductor device claimed in claim 1, wherein the time taken for removing said polymer layer on the sidewall of said via contact hole and a portion of said photoresist layer on said SiO$_2$ layer by using said stripper solution is from 5 to 30 minutes.

6. A method of forming a via contact hole of a semiconductor device claimed in claim 1, wherein said protecting film formed on the bottom of said via contact hole consists of Al$_2$O$_3$.

7. A method of forming a via contact hole of a semiconductor device having a metal layer comprising the steps of:

forming a metal layer on a wafer;
forming a SiO$_2$ layer on said metal layer;
forming a photoresist pattern after a photoresist layer is coated on said SiO$_2$ layer;
forming a via contact hole by an etching process employing said photoresist pattern as a mask;
cleaning the wafer in deionized water being added with CO$_2$ gas after said etching process is completed, thereby forming a protecting film on the bottom of said via contact hole;
removing a polymer layer on the sidewall of said via contact hole and a part of said photoresist layer on said SiO$_2$ layer by using a stripper solution after the process of cleaning said wafer in said deionized water is completed;
cleaning said wafer in isopropyl alcohol at room temperature for 1 to 10 minutes in order to remove said stripper solution;
cleaning said wafer in said deionized water being added with 0.2 to 3 l/min. of CO$_2$ gas for 1 to 10 minutes;
drying said wafer by a spin dryer; and
removing the residual of said photoresist layer on said SiO$_2$ layer.

8. A method of forming a via contact hole of a semiconductor device claimed in claim 7, wherein said metal layer consists of Aluminum.

9. A method of forming a via contact hole of a semiconductor claimed in claim 7, further comprising the step of cleaning said wafer in the isopropyl alcohol at room temperature for 1 to 10 minutes in order to remove said deionized wafer after said wafer is cleaned in said deionized water being added with CO$_2$ gas.

10. A method of forming a via contact hole of a semiconductor device claimed in claim 7, wherein the temperature range of said stripper solution for removing said polymer layer on the sidewall of said via contact hole and said photoresist layer on said SiO$_2$ layer is from 50° C. to 100° C.

11. A method of forming a via contact hole of a semiconductor device claimed in claim 7, wherein the time taken for removing said polymer layer on the sidewall of said via contact hole and a portion of said photoresist layer on said SiO$_2$ layer by using said stripper solution is from 5 to 30 minutes.

12. A method of forming a via contact hole of a semiconductor device claimed in claim 7, wherein said protecting film formed on the bottom of said via contact hole consists of Al$_2$O$_3$.

13. A method of forming a via contact hole of a semiconductor device comprising the steps of:

forming a metal layer on a wafer;
forming a SiO$_2$ layer on said metal layer;
forming a photoresist pattern after a photoresist layer is coated on said SiO$_2$ layer;
forming a via contact hole by an etching process employing said photoresist pattern as a mask;
cleaning the wafer in deionized water being added with CO$_2$ gas after said etching process is completed, thereby forming a protecting film on the bottom of said via contact hole;
cleaning said wafer in isopropyl alcohol at room temperature for 1 to 10 minutes in order to remove said deionized water;
removing a polymer layer on the sidewall of said via contact hole and a part of said photoresist layer on said SiO$_2$ layer by using a stripper solution after the process of cleaning said wafer in said deionized water is completed;
cleaning said wafer in said isopropyl alcohol at room temperature for 1 to 10 minutes in order to remove said stripper solution;
cleaning said wafer in said deionized water being added with 0.2 to 3 l/min. of CO$_2$ gas for 1 to 10 minutes;
drying said wafer by a spin dryer; and
removing the residual of said photoresist layer on said SiO$_2$ layer.

14. A method of forming a via contact hole of a semiconductor device having a metal layer claimed in claim 13, wherein said metal layer consists of Aluminum.

15. A method of forming a via contact hole of a semiconductor having a metal layer claimed in claim 13, further comprising the step of cleaning said wafer in the isopropyl alcohol at room temperature for 1 to 10 minutes in order to remove said deionized water after said wafer is cleaned in said deionized water being added with CO$_2$ gas.

16. A method of forming a via contact hole of a semiconductor device having a metal layer claimed in claim 13, wherein the temperature range of said stripper solution for removing said polymer layer on the sidewall of said via contact hole and said photoresist layer on said SiO$_2$ layer is from 50° C. to 100° C.

17. A method of forming a via contact hole of a semiconductor device having a metal layer claimed in claim 13, wherein the time taken for removing said polymer layer on the sidewall of said via contact hole and a portion of said photoresist layer on said SiO$_2$ layer by using said stripper solution is from 5 to 30 minutes.

18. A method of forming a via contact hole of a semiconductor device claimed in claim 13, wherein said protecting film formed on the bottom of said via contact hole consists of Al$_2$O$_3$.

19. A method of forming a via contact hole of a semiconductor device comprising the steps of:

forming a metal layer on a wafer;
forming a SiO$_2$ layer on said metal layer;
forming a photoresist pattern after a photoresist layer is coated on said SiO$_2$ layer;
forming a via contact hole by an etching process employing said photoresist pattern as a mask;
forming a protective film of oxide of metal of said metal layer on the bottom of said via contact hole by cleaning the wafer with said via contact hole in deionized water being added with CO$_2$ gas after said etching process is completed;
removing a polymer layer on the sidewall of said via contact hole and a part of said photoresist layer on said SiO$_2$ layer by using a stripper solution after the process of cleaning said wafer in said deionized water is completed; and
removing the residual of said photoresist layer on said SiO$_2$ layer.

20. A method of forming a via contact hole of a semiconductor device claimed in claim 19, wherein the oxide of the metal is Al$_2$O$_3$.

* * * * *